United States Patent
Pwu et al.

(10) Patent No.: US 9,660,638 B1
(45) Date of Patent: May 23, 2017

(54) ONE WIRE PARASITE POWER SWITCH CONTROL CIRCUIT

(71) Applicant: Maxim Integrated Products, Inc., San Jose, CA (US)

(72) Inventors: Shiau Chwun George Pwu, Frisco, TX (US); Chen-Hsien Hung, Dallas, TX (US); Matthew Ray Harrington, Carrolton, TX (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/852,012

(22) Filed: Sep. 11, 2015

Related U.S. Application Data

(60) Provisional application No. 62/137,660, filed on Mar. 24, 2015.

(51) Int. Cl.
- *H03B 1/00* (2006.01)
- *H03K 3/00* (2006.01)
- *H03K 17/12* (2006.01)
- *H03K 5/24* (2006.01)
- *H03K 21/40* (2006.01)

(52) U.S. Cl.
CPC ............ *H03K 17/122* (2013.01); *H03K 5/24* (2013.01); *H03K 21/40* (2013.01)

(58) Field of Classification Search
CPC ............................ H03K 17/063; H03K 17/687
USPC .............. 327/108–112, 333, 427, 434, 437; 326/82, 83, 87; 363/127; 307/66, 115, 307/41; 710/74, 20, 62
See application file for complete search history.

(56) References Cited

U.S. PATENT DOCUMENTS

| | | | |
|---|---|---|---|
| 2002/0039051 A1* | 4/2002 | Ito ........................... | H03L 7/093 331/25 |
| 2011/0149623 A1* | 6/2011 | Peak, Jr. ................ | H02M 7/217 363/127 |
| 2011/0210762 A1* | 9/2011 | Hirose ................. | H03K 5/2481 327/73 |

* cited by examiner

*Primary Examiner* — Lincoln Donovan
*Assistant Examiner* — Thomas Skibinski
(74) *Attorney, Agent, or Firm* — North Weber & Baugh LLP

(57) ABSTRACT

A power switch control circuit is provided for power management in one-wire application. The circuit comprises a controllable switch coupled between an input node and an internal power node. A comparator is utilized for power loss sensing to close the switch when necessary to minimize the power loss while the input is low or floating. A watchdog circuit is incorporated within the control circuit to pull down the input node periodically to detect small leakage current when the input node is floating.

19 Claims, 4 Drawing Sheets

ONE WIRE PARASITE POWER SWITCH CONTROL CIRCUIT

CROSS-REFERENCE TO RELATED APPLICATIONS

The application claims priority to U.S. Provisional Patent Application No. 62/137,660, entitled "One Wire Parasite Power Switch Control Circuit", filed Mar. 24, 2015, which application is hereby incorporated herein by reference in its entirety.

BACKGROUND

A. Technical Field

The present invention relates generally to an active power switch control circuit and method for its implementation for one-wire applications.

B. Background of the Invention

In one-wire applications, a power management unit assists in maintaining the communication between an electronic device and an external source via a one-wire I/O interface. The one-wire I/O interface may serve as input port, output port and power supply port. Typically, the external source can only supply power when the input signal to the I/O interface is high. For optimum power management, properly turning off the power supply is necessary to prevent leakage when the external input signal is lower than the internal voltage level.

Various efforts have been made to improve the power switch controlling methods available for one-wire applications. In one example, a controllable switch may be coupled between the electronic device and the external source. The controllable switch may be switched on/off depending on a result from a comparison between the input voltage from the external source and an internal voltage within the electronic device. When the input voltage from the external source is below the internal voltage, the controllable switch is switched OFF to current flowing back toward the external source. To switch off the controllable switch, at least one threshold voltage difference is required, which may cause the power loss too large for desired power management performance.

It would be desirable to implement improved voltage comparison and switch control to reduce power loss within one-wire applications.

SUMMARY OF THE INVENTION

Embodiments of the invention relate to an active power switch control circuit and method for its implementation for one-wire applications.

In various embodiments, a power switch control circuit is provided for power management of one-wire communication between an electronic device and an external source. The electronic device may be a portable electronic apparatus or an accessory. The circuit comprises a controllable switch coupled between an input node and an internal power node. During operation, the input node connects to an external source for one-wire I/O communication. The signals of the input node and the internal power node are fed into a comparator for voltage comparison and power loss sensing. The output of the comparator is utilized to switch ON/OFF the switch. Furthermore, a watchdog circuit is incorporated within the control circuit to pull down the input node periodically to detect small leakage current when the input node is floating.

In these certain embodiments and during normal operation, the one wire I/O is shared for both signal path and power path. A large capacitor is coupled to the power node to reserve energy for the electronic device. The comparator is utilized to sense the voltage difference between the input node and the power node. The controllable switch is turned off when the input node voltage is pulled low. In some embodiments, a diode is incorporated with the power switch control circuit and is utilized during the initial power up stage to ensure the power flowing into the electronic device when the input node voltage is not enough for comparator operation.

In certain operation conditions, the input node is floating and a small current leakage may happen, even though the internal input node may have high impedance to ground. The small leakage current may cause unnecessary power loss from the electronic device, especially when the controllable switch is still ON. When the current leakage is below a certain threshold, the comparator may not identify the voltage difference between the input node and the power node and will not switch OFF the controllable switch. Therefore, the power loss is therefore not prevented. To prevent power loss under the above scenario, a watchdog circuit is incorporated within the control circuit to periodic generate a small pulse to enable a small current source pulling the external node down. During normal operation, the external power is much stronger than the pulling-down current source, so that the operation will not be affected. When the input node is floating, the pulling-down current can induce a quick voltage drop to enable the comparator turning off the controllable switch, and thus prevent power loss.

In some embodiments, the watchdog circuit has a ring oscillator designed to provide clock signal for the generation of periodic current pulses. A frequency divider may be incorporated to lower the frequency of the clock prevent excessive power consumption from the periodic current pulses. The ON period of the pulses may be adjusted for optimized switch control implementation with minimized power consumption.

BRIEF DESCRIPTION OF THE DRAWINGS

Reference will be made to exemplary embodiments of the present invention that are illustrated in the accompanying figures. Those figures are intended to be illustrative, rather than limiting. Although the present invention is generally described in the context of those embodiments, it is not intended by so doing to limit the scope of the present invention to the particular features of the embodiments depicted and described.

One skilled in the art will recognize that various implementations and embodiments of the invention may be practiced in accordance with the specification. All of these implementations and embodiments are intended to be included within the scope of the invention.

DETAILED DESCRIPTION OF THE PREFERRED EMBODIMENTS

In the following description, for the purpose of explanation, specific details are set forth in order to provide an understanding of the present invention. The present invention may, however, be practiced without some or all of these details. The embodiments of the present invention described below may be incorporated into a number of different electrical components, circuits, devices, and systems. Structures and devices shown in block diagram are illustrative of exemplary embodiments of the present invention and are not to be used as a pretext by which to obscure broad teachings of the present invention. Connections between components within the figures are not intended to be limited to direct connections. Rather, connections between components may be modified, re-formatted, or otherwise changed by intermediary components.

When the specification makes reference to "one embodiment" or to "an embodiment", it is intended to mean that a particular feature, structure, characteristic, or function described in connection with the embodiment being discussed is included in at least one contemplated embodiment of the present invention. Thus, the appearance of the phrase, "in one embodiment," in different places in the specification does not constitute a plurality of references to a single embodiment of the present invention.

Various embodiments of the invention are used for power switch control for power management in one-wire communication between an electronic device and an external source. The electronic device may be a portable electronic apparatus, an accessory or the like. The circuit comprises a controllable switch coupled between an input node and an internal power node. During operation, the input node connects to an external source for one-wire I/O communication. The signals of the input node and the internal power node are fed into a comparator for voltage comparison and power loss sensing. The output of the comparator is utilized to switch ON/OFF the switch. Furthermore, a watchdog circuit is incorporated within the control circuit to pull down the input node periodically to detect small leakage current when the input node is floating.

Figure 1:
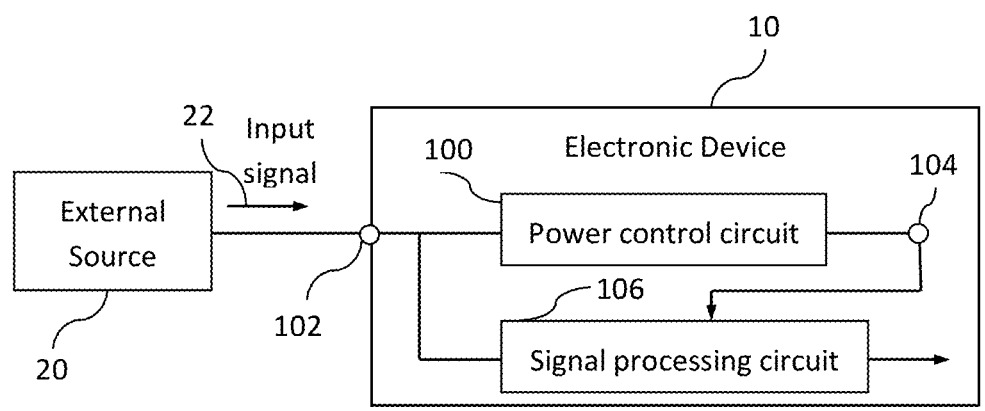
FIG. 1 is a schematic diagram of an electronic device in communication with an external source via a one-wire I/O interface in accordance with an embodiment of the present invention.

FIG. 1 shows a schematic diagram of an electronic device 10 in communication with an external source 20 via a one-wire I/O interface 102 according to various embodiments of the invention. The one-wire I/O interface 102 may be referred as an input node to receive an input signal 22 from the external source 20, an output node or a power supply node only. The input signal typically comprises data and a first power signal with a first voltage level. A power control circuit 100 couples between the one-wire I/O interface 102 and an internal power node 104 providing a second power signal with a second voltage level. A signal processing circuit 106 couples to the one-wire I/O interface 102 for signal communication with the external source 20. The signal processing circuit 106 may be an IC circuit, a programmable logic circuit containing an electronic algorithm, a processor, or any circuit that is to be operated using power extracted from the input signal 22, such as the second power signal from internal power node 104.

The external source 20 may be a computer device, a laptop, a portable media player, such as a MP3 player, a smart phone, etc. The electronic device 10 may be an electronic device supporting one-wire communication. In one embodiment, the electronic device 10 is an audio accessory such as a microphone, a headphone, loudspeakers, an audio amplifier, or the like. In another embodiment, the one-wire interface 102 may be incorporated as one port of a communication interface having multiple ports.

Figure 2:
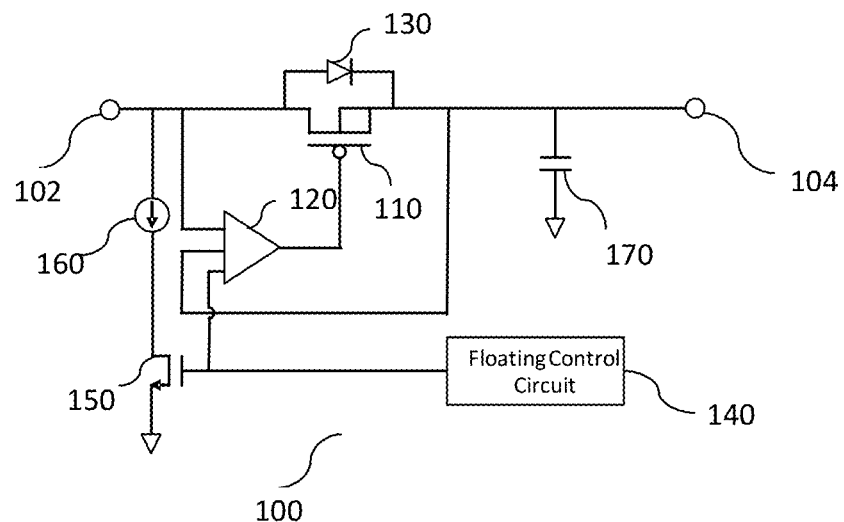
FIG. 2 is an exemplary schematic diagram of a power control circuit according to various embodiments of the invention.

FIG. 2 illustrates an exemplary schematic diagram of a power control circuit according to various embodiments of the invention. The power control circuit 100 comprises a controllable switch 110 coupled between the one-wire interface 102 (functioned as input node) and the internal power node 104, an comparator 120, a storage capacitor 170 coupled to the internal power node 104. The comparator 120 takes inputs from the input node 102 and internal power node 104, and generates an output signal to control the controllable switch 110. If the comparator 120 senses that the voltage at the input node 102 is larger or equal to the voltage of the voltage at the internal power node 104, it outputs a signal to turn ON the switch 110 to pass the input voltage signal to the internal power node 104. If the voltage at the input node 102 is less than the voltage of the voltage at the internal power node 104, the comparator 120 outputs a signal to turn OFF the switch 110 to disallow current to flow from the internal power node 104 back toward the input node 102. The storage capacitor 170 couples to the internal power node 104 and is charged by the input signal 22 to store energy. When the switch 110 is OFF, the storage capacitor 170 provides stored energy to power internal circuits of the electronic device, such as the comparator 120 and the signal processing circuit 106, etc.

In one embodiment, the controllable switch is a P-channel transistor, which has almost no voltage drop when the transistor is ON. In another embodiment, a diode 130 is connected to the controllable switch 110 in parallel. The diode ensures that, during the initial power up stage, when the voltage of the input signal 22 is not enough to power the comparator 120, the input power is able to flow into the internal power node 104 via the diode. Once the controllable switch 110 is turned on, the diode 130 is basically off because the switch has almost no voltage drop. Such arrangement ensures no voltage loss after the switch 110 is turned ON.

In one embodiment, the power control circuit 100 further comprises a current source 160, a second controllable switch 150 and a floating control circuit 140. The current source 160 couples to the input node 102 and also to ground via the second controllable switch 150. The floating control circuit 140 outputs a control signal to switch off the power switch 110, and switch ON the second controllable switch 150. When the input node is floating, a small current leakage from the input node 102 may happen. Since the leakage is so small, internal power node 104 may track the input node 102 very well when the switch 110 is ON. In that case, the comparator 120 may not be able to differentiate the voltage different and to switch off the switch 110 to prevent power loss. To avoid such power loss, the floating control circuit 140 generates periodic small pulses to switch ON the second controllable switch 150 to allow pulling-down current pulses from the current source 160. The pulling-down current pulses is very limited in energy and therefore its influence to the normal operation (when the input node is powered) is negligible. However, when the input node 102 is floating, the pulling-down current pulses may induce a quick voltage drop toward the input node to enable the comparator to operate and turn off the controllable switch 110. By doing so, the power loss due to small current leak is prevented.

Figure 3:
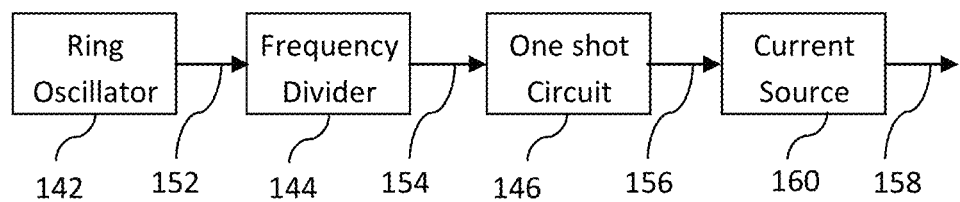
FIG. 3 is an exemplary block diagram of a floating control circuit according to various embodiments of the invention.

FIG. 3 is an exemplary block diagram of floating control circuit operation according to various embodiments of the invention. The floating control circuit comprises a ring oscillator 142, a frequency divider 144 and a one-shot circuit 146. The ring oscillator 142 provides a clock signal 152 to the frequency divider 144 for the generation of an adjusted clock signal 154 with a desired or predetermined frequency. The one-shot circuit 146 receives the adjusted clock signal 154 and generates periodic small pulses 156 with predetermined pulse ON time. The periodic small pulses 156 are applied to the voltage controlled current source 160 (via the second controllable switch 150) to turn ON or OFF the pulling-down current pulses 158.

Figure 4:
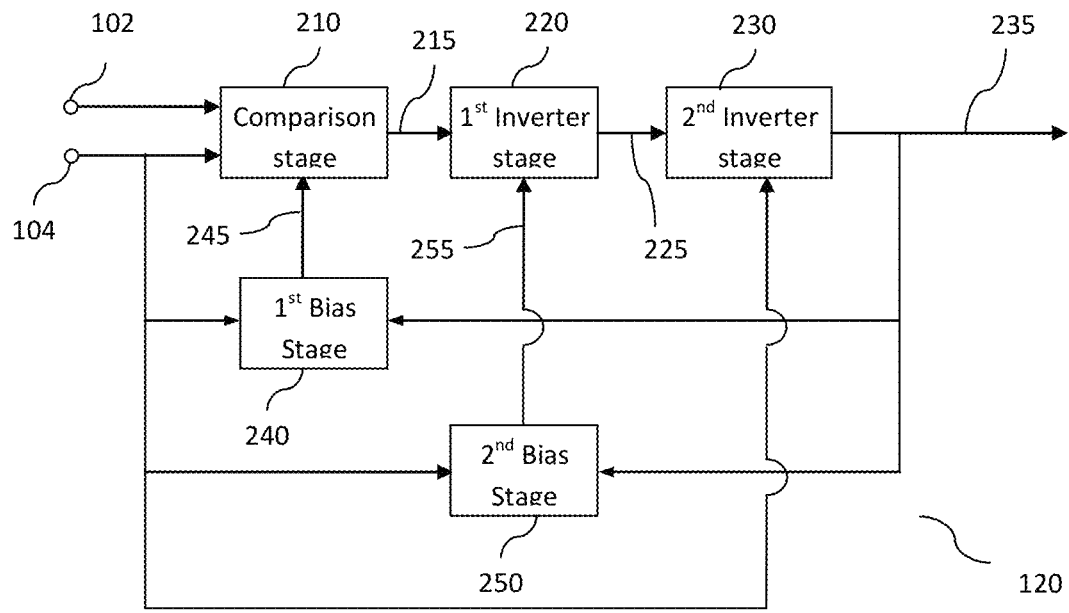
FIG. 4 is an exemplary schematic diagram of a comparator of the power control circuit according to various embodiments of the invention.

FIG. 4 is an exemplary block diagram of a comparator of the power control circuit according to various embodiments of the invention. Referring to FIG. 4, a comparison stage 210 receives signals from both the input node 102 and internal power node 104 for voltage comparison. In certain embodiments of the invention, this comparison stage 220 receives a first bias signal 245 from first bias stage 240, which also powered by the internal power node 104. The first bias signal 245 facilitates the operation of the comparison stage 210 for fast processing the voltage difference between the input node 102 and internal power node 104. A second bias stage 250, also powered by the internal power node 104, provides a second bias signal to the first inverter stage 220 to facilitate the operation of the first inverter stage 220 for fast processing.

The output 215 of the comparison stage 210 is provided to a first inverter stage 220. The output 225 on the first inverter stage 220 is provided to the second inverter stage 230 to generate a final output 235 representing the opposite logic-level to the output 225 to switch ON/OFF the first controllable switch 110. The final output 235 is also fed back to the first bias stage 240 and used to control the generation of the first bias signal 245.

Figure 5:
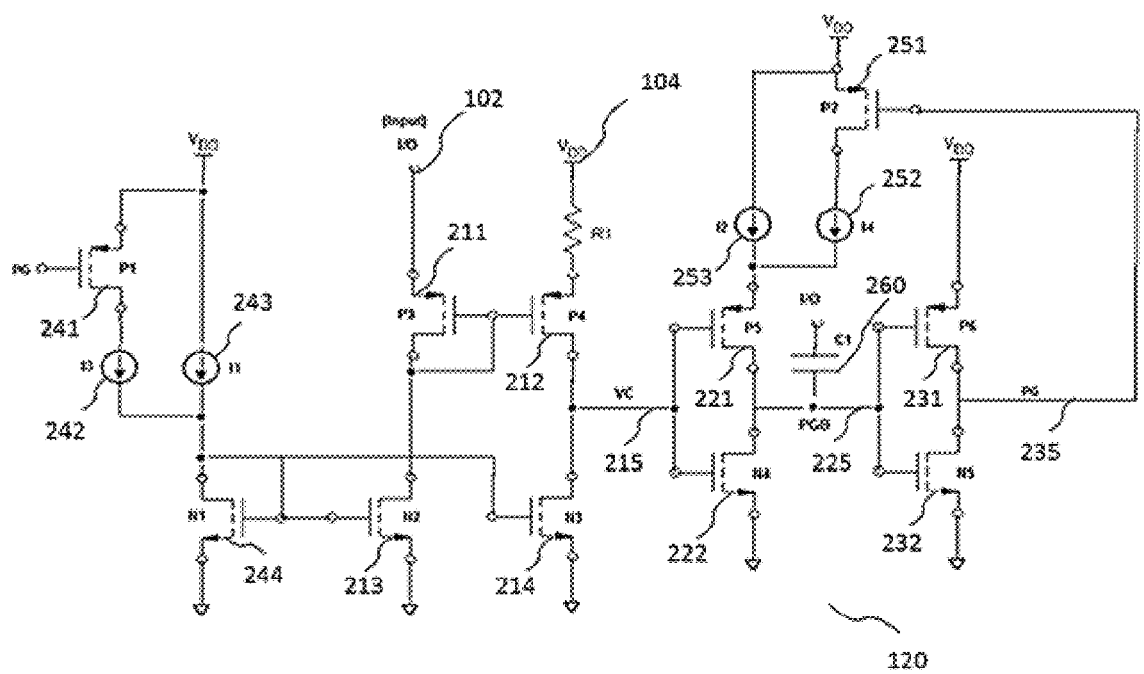
FIG. 5 is an exemplary schematic diagram of a comparator of the power control circuit according to various embodiments of the invention.

FIG. 5 shows an exemplary schematic diagram of a comparator of the power control circuit according to various embodiments of the invention. The comparator 120 takes inputs from the input node 102 and internal power node 104, and generates an output signal (PG) 235 to switch ON/OFF the controllable switch 110 (not shown in FIG. 5).

Transistor P3 211, P4 212, N2 213 and N3 214 form the comparison stage. The transistors P3 and P4 couple to the input node 102 and internal power node 104 respectively. The transistors N2 and N3 function as current mirrors of the transistors P3 and P4 respectively. The voltage VC at the joint point of transistors P4 and N3 is extracted as comparison stage output voltage 215. If the input node 102 has a voltage higher than the internal power node 104, the voltage VC (output voltage 215) is decreased. On the other side, if the input node 102 has a voltage lower than the internal power node 104, the voltage VC (output voltage 215) is increased.

Transistor P1 241, N1 244, current source I3 242 and I1 243 form the first bias stage 240. The output signal (PG) 235 of the comparator is fed back to the gate of the transistor P1 241 to switch ON/OFF of the transistor 241 for engaging/disengaging the current source I3, which has higher current rating than current source I1. Current source I3 242 is connected to current source I1 243 in parallel via the transistor P1 241. When the output signal (PG) 235 is high, the first controllable switch 110 is OFF to prevent power loss. At the same time, transistor P1 241 is also OFF to disengage the current source I1 from the internal power node 104 to prevent power drainage. Current sources I1 and I3 bias the transistor N1 244 and generates a voltage on the gate of transistor N1 (functioning as a current mirror). The gate voltage is the first bias signal 245 and also applied to the gates of transistors N2 and N3.

Transistor P5 221 and N4 222 form the first inverter stage 220, which is powered by the second bias stage 250. The first inverter stage 220 takes the output 215 from the comparison stage 210 and provides an output 225 (PGB) to the second inverter stage 230.

Transistor P2 251, current source I4 252 and I2 253 form the second bias stage 250. The output signal (PG) 235 of the comparator is fed back to the gate of the transistor P2 251 to switch ON/OFF of the transistor 251 for engaging/disengaging the current source I4, which has higher current rating than current source I2. Current source I4 252 is connected to current source I2 253 in parallel via the transistor P2 251. When the output signal (PG) 235 is high to switch OFF the first controllable switch 110, transistor P1 241 is also OFF to disengage the current source I4 from the internal power node 104 to prevent power drainage. Current sources I2 and I4 generate a voltage on the source of transistor P5 221 to facilitate the operation of the first inverter 220.

Transistor P6 231 and N5 232 form the second inverter stage 230, which is powered by internal power node 104. The second inverter stage 230 takes the output 225 from the first inverter stage 220 and provides the final output 235 (PG) to switch ON/OFF the first controllable switch 110 and to provide feedback to the first and second bias stages.

The comparator 120 outputs a high output signal (PG) 235 when the voltage of the input node 102 is higher than the internal power node 104. When the voltage of the input node 102 drops below the internal power node 104, the comparator 120 needs to quickly generate a high output signal (PG) 235 to switch off the first controllable switch 110 to prevent power loss. Before the output signal (PG) 235 turns high, the transistors P1 and P2 remain ON to allow the current source I3 and I4 continuing operation. The higher current ratings of the current sources I3 and I4 enable the comparator to generate the high output signal (PG) 235 faster to quickly switch OFF the first controllable switch 110.

In one embodiment, the output 225 from the first inverter stage 220 is coupled to the input node 102 via a coupling capacitor 260. The coupling capacitor 260 is much smaller in capacitance than the storage capacitor 170, such that the energy dissipation on the coupling capacitor 260 has negligible or little influence on the energy stored within the storage capacitor 170. This coupling provides additional means to generate desired final output signal 235. The coupling capacitor 260 may also effectively reduce the switch 110 turn-off time.

FIGS. 4 and 5 illustrate examples of a comparator in accordance with various embodiments of the present invention. One skilled in the art will recognize that numerous different circuit implementations may be used in which bias stage output is used to control the comparison stage in relation to changes of the input voltage signals of the comparator, and using the bias signals for faster comparator operation compared to the case of no bias stages.

Figure 6:
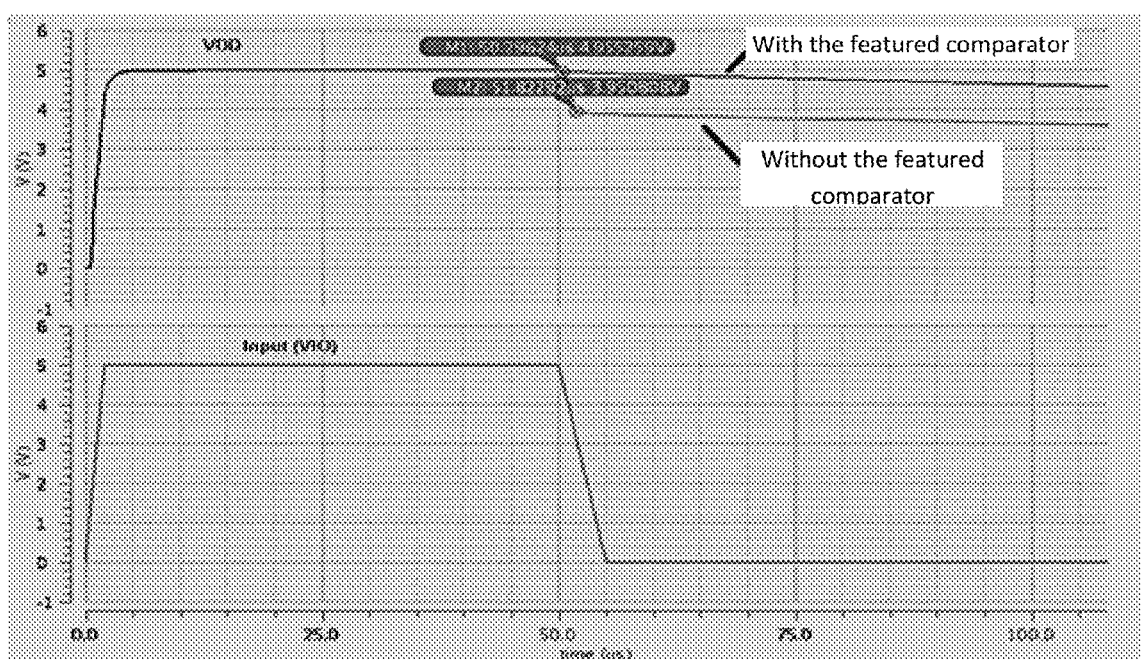
FIG. 6 is a simulated transition response of the featured comparator according to various embodiments of the invention.

FIG. 6 is a simulated transition response of the featured comparator according to various embodiments of the invention. The input node voltage starts to decrease at 50 μs moment. The power control circuit with the featured comparator as shown in FIG. 5 switches OFF the switch faster than a power control circuit without the featured comparator. As a result, the internal power node voltage remains approximately 1V higher for the power control circuit with the featured comparator, and therefore is able to power the electronic device longer when the input node has a low voltage (a logic low) input.

The foregoing description of the invention has been described for purposes of clarity and understanding. It is not intended to limit the invention to the precise form disclosed. Various modifications may be possible within the scope and equivalence of the application.

The invention claimed is:

1. An electronic device for active power control, the electronic device comprising:
    an input node on which data and a first power signal is received;
    an internal power node that provides a second power signal;
    a power control circuit coupled to the input node and the internal power node, the power control circuit isolates the input node from the internal power node in response to a first voltage level on the first power signal being below a second voltage level on the second power signal, the power control circuit further detects when the input node transitions to a floating state and in response isolates the input node from the internal power node; and
    a signal processing circuit coupled to the input node, the signal processing circuit processes at least a portion of the data received on the input node.

2. The electronic device of claim 1 wherein the power control circuit comprises:
    a comparator coupled to the input node and the internal power node, the comparator receives the first power signal and the second power signal and generates an output signal based on a comparison of the first and second power signals; and
    a first controllable switch coupled to receive the output signal, the first controllable switch prevents current from flowing from the internal power node to the input node when the first voltage signal has a voltage level below the second power signal.

3. The electronic device of claim 2 further comprises:
    a current source coupled to the input node, the current source generates pulling-down current pulses;
    a floating control circuit that generates a control signal, the control signal having periodic small pulses; and
    a second controllable switch coupled to the current source and the floating control circuit, the second controllable switch allows periodic pulling down current pulses from the current source, the periodic pulling down current pulses induce a voltage drop on the input node in response to the input node transitioning to a floating state.

4. The electronic device of claim 3 wherein the voltage drop enables the comparator to turn off the first controllable switch.

5. The electronic device of claim 3 wherein the floating control circuit comprises a ring oscillator, a frequency divider and a one-shot circuit, the ring oscillator providing a clock signal to the frequency divider for the generation of an adjusted clock signal with a predetermined frequency, the one-shot circuit receiving the adjusted clock signal and generating the periodic small pulses.

6. The electronic device of claim 3 wherein the comparator comprises:
    a comparison stage coupled to the input node and the internal power node for voltage comparison;
    a first inverter stage receiving an output from the comparison stage; and
    a second inverter stage receiving an output from the first inverter stage and generating the output signal of the comparator to control the first controllable switch.

7. The electronic device of claim 6 wherein the comparator further comprises a first bias stage coupled to both the internal power node and the output signal from the second inverter stage, the first bias stage outputting a first bias signal to the comparison stage to facilitate the voltage comparison.

8. The electronic device of claim 6 wherein the comparator further comprises a second bias stage coupled to both the internal power node and the output signal from the comparator, the second bias stage outputting a second bias signal to the first inverter stage to facilitate an operation of the first inverter stage.

9. The electronic device of claim 1 further comprises a diode coupled between the input node and the internal power node to allow current flow from the input node to the internal power node only.

10. A method for active power control of an electronic device, the method comprising:
    identifying an input node and an internal power node within the electronic device, the input node receiving data and a first power signal, the internal power node providing a second power signal;
    isolating the input node from the internal power node in response to a first voltage level on the first power signal below a second voltage level on the second power signal; and
    detecting when the input node transitions to a floating state and in response isolates the input node from the internal power node.

11. The method of claim 10 wherein:
    a comparator receives the first power signal and the second power signal and generates an output signal based on a comparison of the first and second power signals; and
    a first controllable switch prevents current from flowing from the internal power node to the input node when the first voltage signal has a voltage level below the second power signal.

12. The method of claim 11 further comprises:
    coupling a current source coupled to the input node, the current source generates pulling-down current pulses;
    coupling a second controllable switch to the current source, the second controllable switch allows periodic pulling down current pulses from the current source, the periodic pulling down current pulses induce a voltage drop on the input node in response to the input node transitioning to a floating state.

13. The method of claim 12 wherein the voltage drop enables the comparator to turn off the first controllable switch.

14. The method of claim 12 wherein the floating control circuit comprises a ring oscillator, a frequency divider and a one-shot circuit, the ring oscillator providing a clock signal to the frequency divider for the generation of an adjusted clock signal with a predetermined frequency, the one-shot circuit receiving the adjusted clock signal and generating the periodic small pulses.

15. The method of claim 11 wherein the comparator comprises at least one bias stage coupled to both the internal power node and the output from the comparator, the at least one bias stage providing at least one bias signal to facilitate the comparator operation.

16. A voltage comparator comprising
- a comparison stage receiving inputs from a first node and a second node for voltage comparison;
- a first inverter stage receiving an output from the comparison stage;
- a second inverter stage receiving an output from the first inverter stage and generating a comparator output; and
- a first bias stage coupled to both the first node and the comparator output, the first bias stage outputting a first bias signal to the comparison stage to facilitate the comparison stage operation.

17. The voltage comparator of claim 16 wherein the comparator further comprises a second bias stage coupled to both the first node and the comparator output, the second bias stage outputting a second bias signal to the first inverter stage to facilitate the first inverter stage operation.

18. The voltage comparator of claim 16 wherein the second inverter stage is powered from the second node.

19. The voltage comparator of claim 16 wherein the comparator further comprises a coupling capacitor coupled between the first node and the first inverter stage output.

* * * * *